United States Patent
Jung

(10) Patent No.: US 11,328,787 B2
(45) Date of Patent: May 10, 2022

(54) ONE-TIME PROGRAMMABLE MEMORY CIRCUIT AND SEMICONDUCTOR APPARATUS INCLUDING THE SAME

(71) Applicant: SK hynix Inc., Icheon-si (KR)

(72) Inventor: Chui Moon Jung, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 22 days.

(21) Appl. No.: 16/709,535

(22) Filed: Dec. 10, 2019

(65) Prior Publication Data
US 2020/0327951 A1    Oct. 15, 2020

(30) Foreign Application Priority Data
Apr. 15, 2019  (KR) .................. 10-2019-0043910

(51) Int. Cl.
| | |
|---|---|
| *G11C 29/00* | (2006.01) |
| *G11C 29/38* | (2006.01) |
| *G11C 17/18* | (2006.01) |
| *G11C 17/16* | (2006.01) |
| *G11C 29/44* | (2006.01) |

(52) U.S. Cl.
CPC ............. *G11C 29/38* (2013.01); *G11C 17/16* (2013.01); *G11C 17/18* (2013.01); *G11C 29/4401* (2013.01)

(58) Field of Classification Search
CPC ..... G11C 29/38; G11C 29/4401; G11C 17/16; G11C 17/18
See application file for complete search history.

(56) References Cited

U.S. PATENT DOCUMENTS

| | | | |
|---|---|---|---|
| 9,978,463 B2 | 5/2018 | Kim et al. | |
| 2013/0336040 A1* | 12/2013 | Walker | G11C 7/20 365/94 |
| 2014/0219000 A1* | 8/2014 | Oh | G11C 7/24 365/96 |
| 2016/0034348 A1* | 2/2016 | Park | G11C 29/42 714/764 |

* cited by examiner

*Primary Examiner* — Samir W Rizk
(74) *Attorney, Agent, or Firm* — William Park & Associates Ltd.

(57) ABSTRACT

In one embodiment of the present disclosure, an OTP memory circuit may include: a fuse array configured to output fuse data of a fuse set corresponding to a fuse address among a plurality of fuse sets; and a fuse address generation circuit configured to generate the fuse address to search for an available fuse set within a particular region, corresponding to a defective address, among a plurality of regions of the fuse array.

24 Claims, 8 Drawing Sheets

ONE-TIME PROGRAMMABLE MEMORY CIRCUIT AND SEMICONDUCTOR APPARATUS INCLUDING THE SAME

CROSS-REFERENCES TO RELATED APPLICATION

The present application claims priority under 35 U.S.C. § 119(a) to Korean application number 10-2019-0043910, filed on Apr. 15, 2019, in the Korean Intellectual Property Office, which is incorporated herein by reference in its entirety as set forth in full.

BACKGROUND

1. Technical Field

Various exemplary embodiments of the present disclosure relate to a semiconductor circuit and, more particularly, to a one-time programmable (OTP) memory circuit and a semiconductor apparatus is including the same.

2. Related Art

A semiconductor apparatus may include a volatile memory, such as a dynamic random access memory (DRAM), and/or a nonvolatile memory, such as an NAND flash memory.

A semiconductor apparatus may detect a memory cell (hereinafter, referred to as a defective cell), in which a defect occurs, through a test.

A semiconductor circuit may determine whether an externally provided address is an address (hereinafter, referred to as a defective address) for accessing a defective cell. When the externally provided address is a defective address, the semiconductor circuit may access a redundant memory cell (hereinafter, referred to as a redundant cell) instead of the defective cell. This operation is referred to as a repair operation.

A defective address may be recorded in a One-time Programmable (OTP) memory circuit.

The OTP memory circuit, using an electrical fuse (e-fuse), is utilized to make it possible to perform a repair operation after the packaging of a semiconductor apparatus, as well as prior to the packaging of the semiconductor apparatus.

Based on the prior art, when detecting a defective address, an available (i.e., non-programmed) fuse (hereinafter, referred to as an available fuse) is detected through a scan of all the regions of the OTP memory circuit. The defective address is programmed into the is detected available fuse.

Therefore, the time required to scan an available fuse increases, and the test time for a semiconductor apparatus increases, which is problematic.

SUMMARY

In one embodiment of the present disclosure, an OTP memory circuit may include: a fuse array configured to output fuse data of a fuse set corresponding to a fuse address among a plurality of fuse sets; and a fuse address generation circuit configured to generate the fuse address to search for an available fuse set within a particular region, corresponding to a defective address, among a plurality of regions of the fuse array.

In one embodiment of the present disclosure, an OTP memory circuit may include: a fuse array configured to output fuse data of a fuse set corresponding to a fuse address among a plurality of fuse sets; a fuse address generation circuit configured to generate the fuse address to search for an available fuse set within a particular region, corresponding to a defective address, among a plurality of regions of the fuse array; and a data control circuit configured to output corrected fuse data, as an initial value of the fuse data, based on a result of comparing the fuse data with the defective address.

In one embodiment of the present disclosure, a semiconductor apparatus may include: a memory cell array including a plurality of unit memory blocks, wherein a latch array is included in the plurality of unit memory blocks; and a one-time programmable (OTP) memory circuit with a plurality of fuse sets, wherein the OTP memory circuit is configured to program an externally-inputted defective address into the plurality of fuse sets in a Hard-Post Package Repair (HPPR) operation; and configured to output the defective address or an initial value to the latch array based on a result of determining whether the defective address has been already programmed into the plurality of fuse sets in a Soft-Post Package Repair (SPPR) operation.

In one embodiment of the present disclosure, a fuse address generation circuit may include: a counter configured to generate a count signal based on a clock signal; a section signal generation circuit configured to generate section signals based on the count signal and test mode signals; and an address control circuit configured to generate a fuse address based on one among the test mode signals, a defective address and the count signal, wherein the fuse address corresponds to an external region, among a plurality of external regions, in which a search is conducted to find an available fuse set within the external region.

BRIEF DESCRIPTION OF THE DRAWINGS

Features, aspects and embodiments are described in conjunction with the attached drawings, in which.

DETAILED DESCRIPTION

Figure 1:
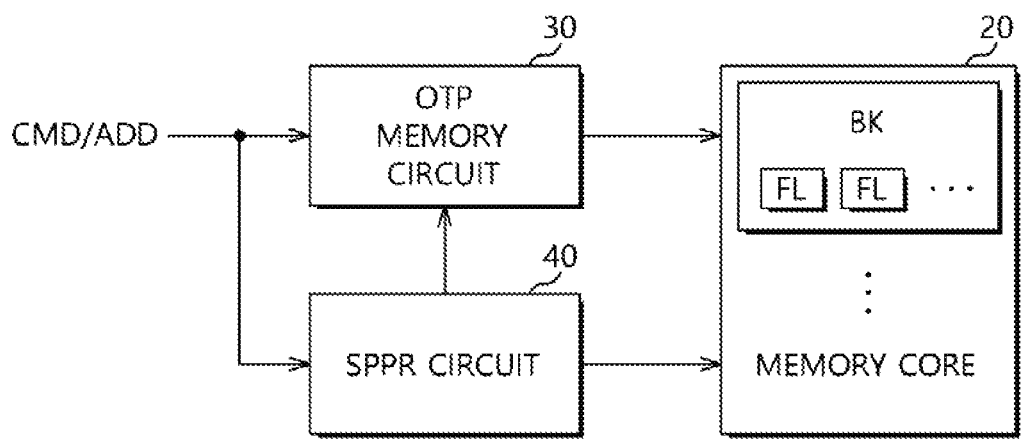
FIG. 1 is a diagram, illustrating a representation of an example of a configuration of a semiconductor apparatus, in accordance with an embodiment of the present disclosure.

Specific structural or functional descriptions of embodiments based on the concept which are disclosed in the present specification or application are illustrated only to describe the embodiments based on the concept of the present disclosure. The embodiments based on the concept of the present disclosure may be carried out in various forms and the descriptions are not limited to the embodiments described in the present specification or application.

Since various modifications and changes may be applied to the embodiment based on the concept of the present disclosure and the embodiment based on the concept of the present disclosure may have various forms, the specific embodiments will be illustrated in the drawings and described in the present specification or application. However, it should be understood that the embodiment based on the concept of the present disclosure is not construed as limited to a specific disclosure form and includes all changes, equivalents, or substitutes that do not depart from the spirit and technical scope of the present disclosure.

While terms such as "first", "second", and/or the like may be used to describe various components, such components should not be limited to the above-described terms. The above-described terms may be used only to distinguish one component from another component. For example, a first component may be referred to as a second component and similarly, a second component may be referred to as a first component without departing from the scope based on the concept of the present disclosure.

It will be understood that when an element is referred to as being "between" two elements, it can be the only element between the two elements, or one or more intervening elements may also be present.

The terms used in the present application are merely used to describe particular embodiments, and are not intended to limit the present disclosure. Singular forms in the present disclosure are intended to include the plural forms as well, unless the context clearly indicates otherwise. It will be further understood that terms such as "including" or "having," etc., are intended to indicate the existence of the features, numbers, operations, actions, components, parts, or combinations thereof disclosed in the specification, and are not intended to preclude the possibility that one or more other features, numbers, operations, actions, components, parts, or combinations thereof may exist or may be added.

Hereinafter, a semiconductor apparatus based on the present disclosure will be described below with reference to the accompanying drawings through exemplary embodiments.

Various embodiments of the present disclosure provide an OTP memory circuit capable of reducing test time of a semiconductor apparatus.

FIG. 1 is a diagram illustrating a representation of an example of a configuration of a semiconductor apparatus in accordance with an embodiment of the present disclosure.

In accordance with an embodiment of the present disclosure, the semiconductor apparatus may perform a repair operation before and after the packaging process.

A repair operation, before the packaging process, is referred to as a normal repair operation, and a repair operation, after the packaging process, is referred to as a post package repair (PPR).

A PPR is classified into a hard-post package repair (Hard-PPR: HPPR) and a soft-post package repair (Soft-PPR: SPPR).

A HPPR may be a repair operation performed based on a corresponding defective address, despite the interruption caused by the loss of power to the semiconductor apparatus. A SPPR is a transient repair operation that stores a corresponding defective address in a register or a latch and cannot be performed based on the corresponding defective address as long as the power to the semiconductor apparatus is interrupted.

Referring to FIG. 1, in accordance with an embodiment of the present disclosure, the semiconductor apparatus 10 may include a memory core 20, a One-time Programmable (OTP) memory circuit 30 and a SPPR control circuit 40.

The OTP memory circuit 30 may include a plurality of electrical fuses.

Based on a command CMD, the OTP memory circuit 30 may program (i.e., store) repair-related information (i.e., address ADD related to operations of a normal repair and a hard-post package repair HPPR and/or test mode information) into the plurality of electrical fuses.

Based on a command CMD, the OTP memory circuit 30 may output the stored repair-related information to a component outside of the OTP memory circuit 30 based on.

The repair-related information output from the OTP memory circuit 30 may be provided to the memory core 20 and/or an external component, outside of the semiconductor apparatus 10.

The OTP memory circuit 30 may include a rupture circuit configured to program a defective address into the plurality of electrical fuses through a selective fuse rupture operation in a HPPR mode.

A fuse rupture operation is an operation of breaking a gate insulating layer of a transistor by applying a high voltage to the electrical fuse. A defective address may be programmed through a selective rupture operation suitable for a value of the defective address on the plurality of electrical fuses.

The memory core 20 may include a memory cell array and/or circuit elements configured to store data into the memory cell array and/or configured to read data stored in the memory cell array.

In an embodiment, a volatile memory, such as the DRAM, and/or a nonvolatile memory, such as flash read-only-memory (ROM), and may configure the memory cell array.

The memory cell array may be divided into a plurality of unit memory blocks, for example, a plurality of memory banks BK.

Each of the plurality of memory banks BK may include a latch array FL, configured to store the repair-related information, provided from the OTP memory circuit 30, in a boot-up operation of the semiconductor apparatus 10.

The SPPR control circuit 40 may include a plurality of latches, may store an address ADD related to a soft-post package repair (SPPR) operation into the plurality of latches, and may provide the memory core 20 with data stored in the plurality of latches.

In a SPPR mode, a defective address might not be programmed into the plurality of electrical fuses of the OTP memory circuit 30. Instead, the defective address may be temporarily stored in the plurality of latches of the SPPR control circuit 40. Therefore, in a HPPR mode, a defective address may be redundantly stored in the OTP memory circuit 30. Therefore, the SPPR control circuit 40 may be configured to determine the redundancy of a defective address to control the OTP memory circuit 30.

The address ADD may include an address, provided from an external component in a normal operation of the semiconductor apparatus 10, and a defective address, detected through a test.

Figure 2:
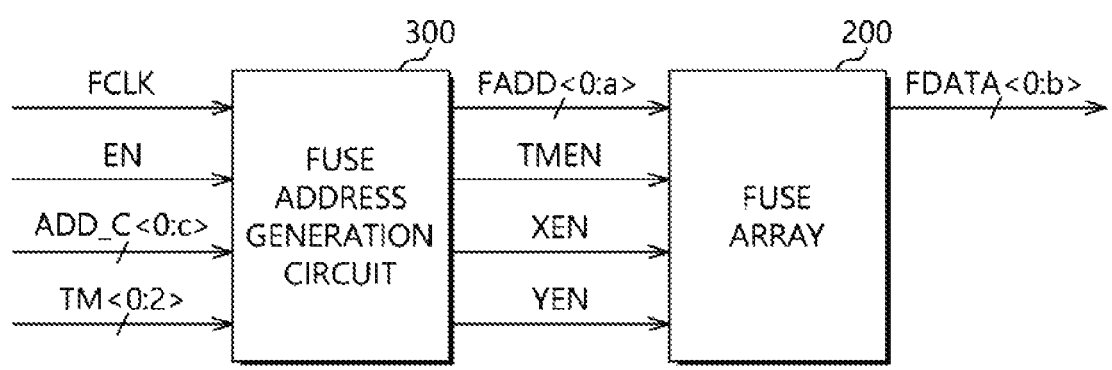
FIG. 2 is a diagram, illustrating a representation of an example of a configuration of an OTP memory circuit of a semiconductor apparatus, in accordance with an embodiment of the present disclosure.

FIG. 2 is a diagram, illustrating a representation of an example of a configuration of an OTP memory circuit of a semiconductor apparatus, in accordance with an embodiment of the present disclosure.

In accordance with an embodiment of the present disclosure, the OTP memory circuit 100 of a semiconductor apparatus may be an example utilizing an electrical fuse as a unit memory cell.

Referring to FIG. 2, in accordance with an embodiment of the present disclosure, the OTP memory circuit 100 of a semiconductor apparatus may include a fuse array 200 and a fuse address generation circuit 300.

The fuse array 200 may include a plurality of electrical fuses.

All regions of the fuse array 200 may be divided by utilization purpose.

All regions of the fuse array 200 may include a first region, allocated for test mode data, a second region, allocated for row repair, and a third region, allocated for column repair.

Electrical fuses of the first region may be utilized for the programming of test mode data. Electrical fuses of the second region may be utilized for the programming of a defective row address. Electrical fuses of the third region may be utilized for the programming of a defective column address.

The fuse array 200 may output fuse data FDATA<0:b>, which are programmed in electrical fuses corresponding to fuse addresses FADD<0:a>.

The fuse array 200 may output the fuse data FDATA<0:b>, based on the fuse addresses FADD<0:a>, during activation sections of a plurality of section signals TMEN, XEN and YEN.

The fuse address generation circuit 300 may generate the fuse addresses FADD<0:a> and may allow the fuse address FADD<0:a> to have a value for selecting a region allocated for defective address ADD_C<0:c> within all regions of the fuse array 200.

The fuse address generation circuit 300 may change a value of the fuse addresses FADD<0:a> such that the fuse addresses FADD<0:a> select electrical fuses within the region allocated for the defective addresses ADD_C<0:c>, among the electrical fuses, included in all regions of the fuse array 200.

The fuse address generation circuit 300 may generate the fuse addresses FADD<0:a> and the plurality of section signals TMEN, XEN and YEN based on an enable signal EN, a clock signal FCLK, test mode signals TM<0:2> and defective address ADD_C<0:c>.

The enable signal EN may be enabled during a predetermined time, for example, an available fuse search time, within a test section of a semiconductor apparatus. The enablement time of the enable signal EN may be variable based on the control of an external component or an internal setting.

The word "predetermined" as used herein with respect to a parameter, such as a predetermined time, means that a value for the parameter is determined prior to the parameter being used in a process or algorithm. For some embodiments, the value for the parameter is determined before the process or algorithm begins. In other embodiments, the value for the parameter is determined during the process or algorithm but before the parameter is used in the process or algorithm.

The test mode signals TM<0:2> may define the test section of a semiconductor apparatus. The test mode signal TM<0> may be utilized for activating a test mode for test mode data output, the test mode signal TM<1> may be utilized for activating a test mode for a row repair operation, and the test mode signal TM<2> may be utilized for activating a test mode for a column repair operation.

Figure 3:
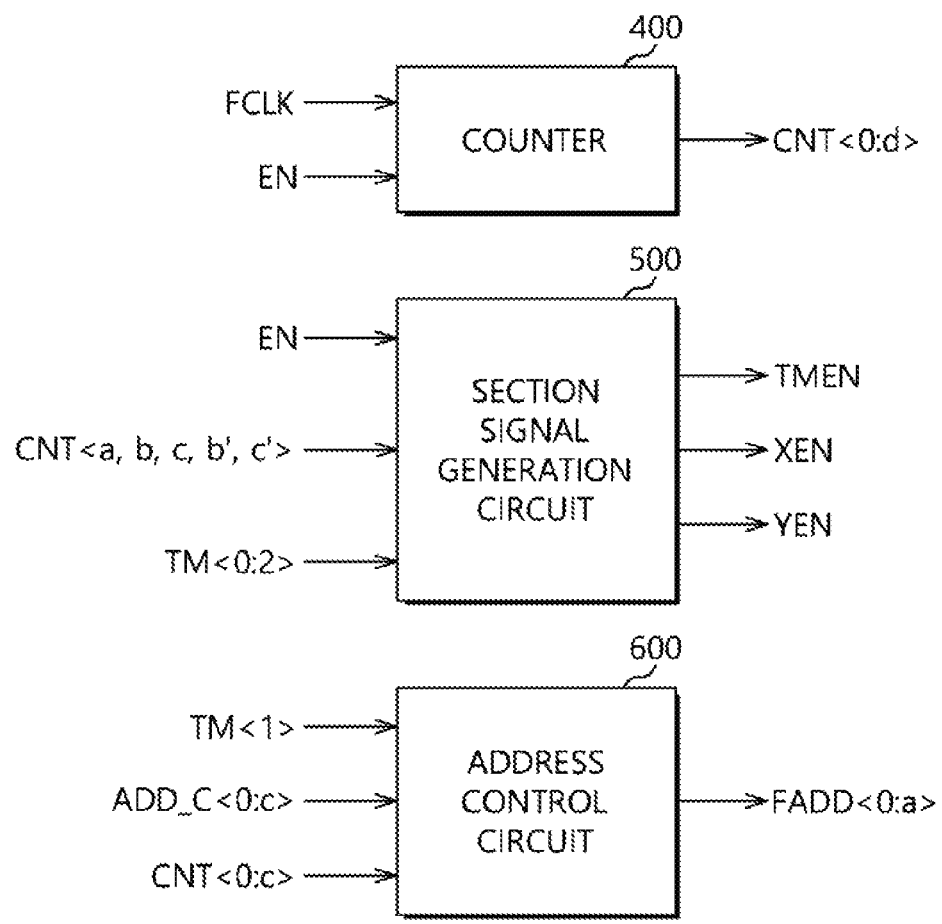
FIG. 3 is a diagram, illustrating a representation of an example of a configuration of a fuse address generation circuit, illustrated in FIG. 2.

FIG. 3 is a diagram, illustrating a representation of an example of a configuration of a fuse address generation circuit, illustrated in FIG. 2.

Referring to FIG. 3, the fuse address generation circuit 300 may include a counter 400, a section signal generation circuit 500 and an address control circuit 600.

The counter 400 may generate count signal CNT<0:d> based on the enable signal EN and the clock signal FCLK.

The count signal CNT<0:d> may have a value corresponding to an address for selecting all regions of the fuse array 200.

The section signal generation circuit 500 may generate the plurality of section signals TMEN, XEN, and YEN, based on the enable signal EN, the test mode signals TM<0:2>, and partial bits CNT<a, b, c, b', c'> of the count signal CNT<0:d>.

Among the plurality of section signals TMEN, XEN, and YEN, the first section signal TMEN may indicate an output section of the test mode data, the second section signal XEN may indicate a search section of an available fuse related to the row repair, and the third section signal YEN may indicate a search section of an available fuse related to the column repair.

The address control circuit 600 may generate the fuse address FADD<0:a> based on defective address ADD_C<0:c>, one of the test mode signals TM<0:2c> (e.g., the test mode signal TM<1>) and a part of the count signal CNT<0:d> (e.g., CNT<0:c>).

Figure 4:
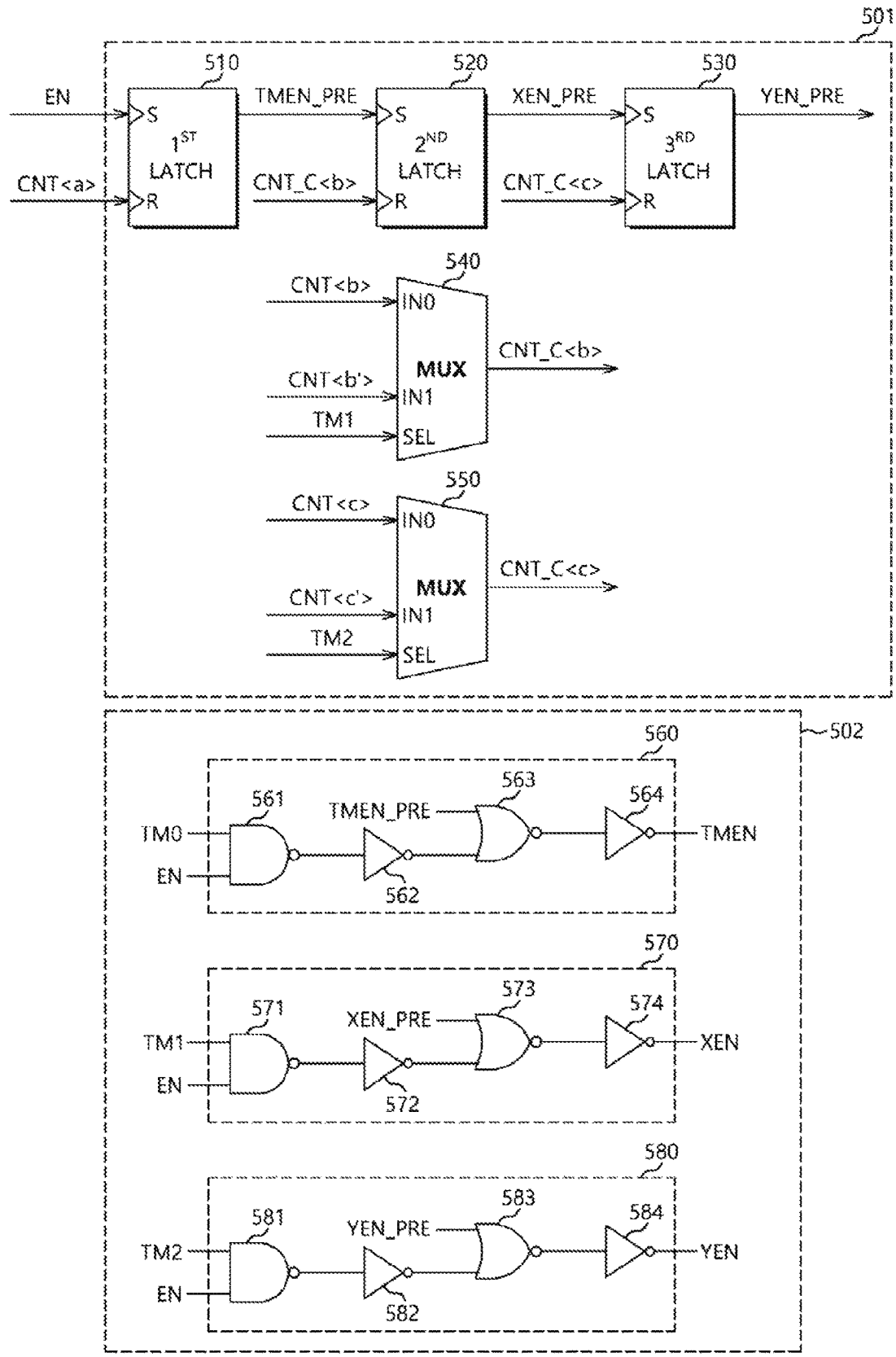
FIG. 4 is a diagram, illustrating a representation of an example of a configuration of a section signal generation circuit, illustrated in FIG. 3.

FIG. 4 is a diagram, illustrating a representation of an example of a configuration of a section signal generation circuit, illustrated in FIG. 3.

Referring to FIG. 4, the section signal generation circuit 500 may include a preliminary section signal generation circuit 501 and a signal combination circuit 502.

The preliminary section signal generation circuit 501 may generate first to third preliminary section signals TMEN_PRE, XEN_PRE, and YEN_PRE, based on the enable signal EN, the test mode signals TM<1:2>, and partial bits CNT<a, b, c, b', c'> of the count signal CNT<0:d>.

The preliminary section signal generation circuit 501 may include first to third latches 510 to 530, a first multiplexer 540, and a second multiplexer 550.

The first latch 510 may change the level of the first preliminary section signal TMEN_PRE to a high level based on the enable signal EN and may change the level to a low level based on a first bit CNT<a>.

The second latch 520 may change the level of the second preliminary section signal XEN_PRE to a high level based on the first preliminary section signal TMEN_PRE and may change the level to a low level based on a first correction signal CNT_C<b>.

The third latch 530 may change the level of the third preliminary section signal YEN_PRE to a high level based on the second preliminary section signal XEN_PRE and may change the level to a low level based on a second correction signal CNT_C<c>.

The first multiplexer 540 may receive the second bit CNT<b> and the third bit CNT<b'>, and the first multiplexer 540 may output one of the signals as the first correction signal CNT_C<b> based on the test mode signal TM<1>.

The second multiplexer 550 may receive the fourth bit CNT<c> and the fifth bit CNT<c'>, and the second multiplexer 550 may output one of the signals as the second correction signal CNT_C<c> based on the test mode signal TM<2>.

The following paragraphs will describe how to set the partial bits CNT<a, b, c, b', c'>, that is, the first bit CNT<a>, the second bit CNT<b>, the third bit CNT<b'>, the fourth bit CNT<c> and the fifth bit CNT<c'> of the count signal CNT<0:d>.

Among all of the electrical fuses of the fuse array 200, a portion of the fuses X may be assigned for the test mode data, another portion of the fuses Y may be assigned for the row repair and still another portion of the fuses Z may be assigned for the column repair.

The Number of fuses X, Y and Z may be independently determined based on the integrity, the circuit design scheme, and so forth of a semiconductor apparatus.

The electrical fuses Y, assigned for row repair, may be divided and allocated for the memory banks BK (refer to FIG. 2). For example, when assumed that a memory device includes 'n' number of memory banks BK1 to BKn, a region of the electrical fuses Y, assigned for the row repair, may be divided into 'm' number of internal regions Y1 to Ym and may be allocated for the 'n' number of memory banks BK1 to BKn.

The electrical fuses Z, assigned for column repair, may also be divided and allocated for the memory banks BK (refer to FIG. 2) in the same way as the electrical fuses Y, assigned for the row repair.

At a time point when the count signal CNT<0:d> sequentially increases, based on the clock signal FCLK, and counting on each region of the electrical fuses X, Y and Z is completed, each of the particular bits CNT<a, b, c> may be transitioned within the count signal CNT<0:d>.

Furthermore, at a time point when each counting on the internal regions of the electrical fuses Y and the internal regions of the electrical fuses Z is completed, each of particular bits CNT<b', c'> may be transitioned within the count signal CNT<0:d>.

Therefore, in accordance with an embodiment of the present disclosure, the first bit CNT<a> may be utilized as a reference to count the electrical fuses X assigned for the test mode data, the second bit CNT<b> may be utilized as a reference to count the electrical fuses Y assigned for the row repair, the third bit CNT<b'> may be utilized as a reference to count the electrical fuses corresponding to the internal regions of the electrical fuses Y, the fourth bit CNT<c> may be utilized as a reference to count the electrical fuses Z assigned for the column repair, and the fifth bit CNT<c'> may be utilized as a reference to count the electrical fuses corresponding to the internal regions of the electrical fuses Z.

The signal combination circuit 502 may generate first to third section signals TMEN, XEN, and YEN, based on the enable signal EN, the test mode signals TM<0:2c>, and the first to third preliminary section signals TMEN_PRE, XEN_PRE, and YEN_PRE.

The signal combination circuit 502 may include first to third combination logics 560 to 580.

The first combination logic 560 may generate the first section signal TMEN by combining the enable signal EN, the test mode signal TM<0>, and the first preliminary section signal TMEN_PRE.

The first combination logic 560 may include first to fourth logic gates 561 to 564.

The first logic gate 561 may perform a NAND operation on the enable signal EN and the test mode signal TM<0>.

The second logic gate 562 may perform an inversion operation on the output signal of the first logic gate 561.

The third logic gate 563 may perform a NOR operation on the first preliminary section signal TMEN_PRE and the output signal of the second logic gate 562.

The fourth logic gate 564 may perform an inversion operation on the output signal of the third logic gate 563 and output, as the first section signal TMEN, the inverted signal.

The second combination logic 570 may generate the second section signal XEN by combining the enable signal EN, the test mode signal TM<1>, and the second preliminary section signal XEN_PRE.

The second combination logic 570 may include first to fourth logic gates 571 to 574.

The first logic gate 571 may perform a NAND operation on the enable signal EN and the test mode signal TM<1>.

The second logic gate 572 may perform an inversion operation on the output signal of the first logic gate 571.

The third logic gate 573 may perform a NOR operation on the second preliminary section signal XEN_PRE and an output signal of the second logic gate 572.

The fourth logic gate 574 may perform an inversion operation on the output signal of the third logic gate 573 and output, as the second section signal XEN, the inverted signal.

The third combination logic 580 may generate the third section signal YEN by combining the enable signal EN, the test mode signal TM<2>, and the third preliminary section signal YEN_PRE.

The third combination logic 580 may include first to fourth logic gates 581 to 584.

The first logic gate 581 may perform a NAND operation on the enable signal EN and the test mode signal TM<2>.

The second logic gate 582 may perform an inversion operation on the output signal of the first logic gate 581.

The third logic gate 583 may perform a NOR operation on the third preliminary section signal YEN_PRE and an output signal of the second logic gate 582.

The fourth logic gate 584 may perform an inversion operation on the output signal of the third logic gate 583 and output, as the third section signal YEN, the inverted signal.

Figure 5:
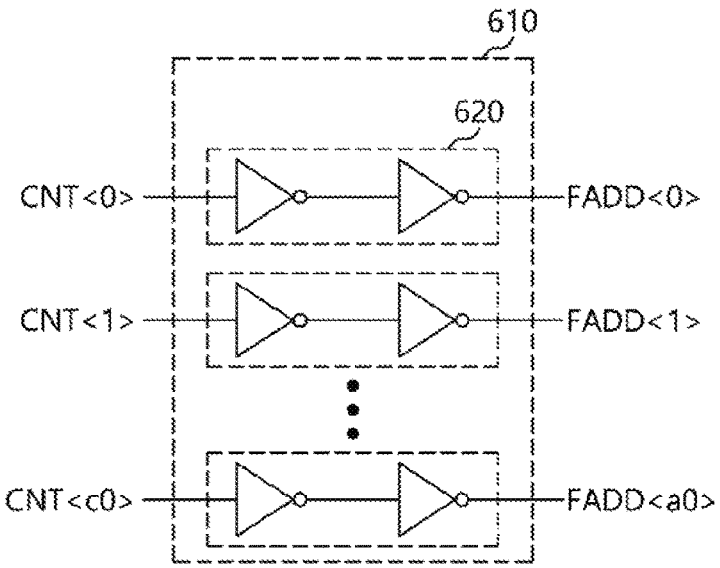
FIG. 5 is a diagram, illustrating a representation of an example of a configuration of an address control circuit, illustrated in FIG. 3.
Figure 5:
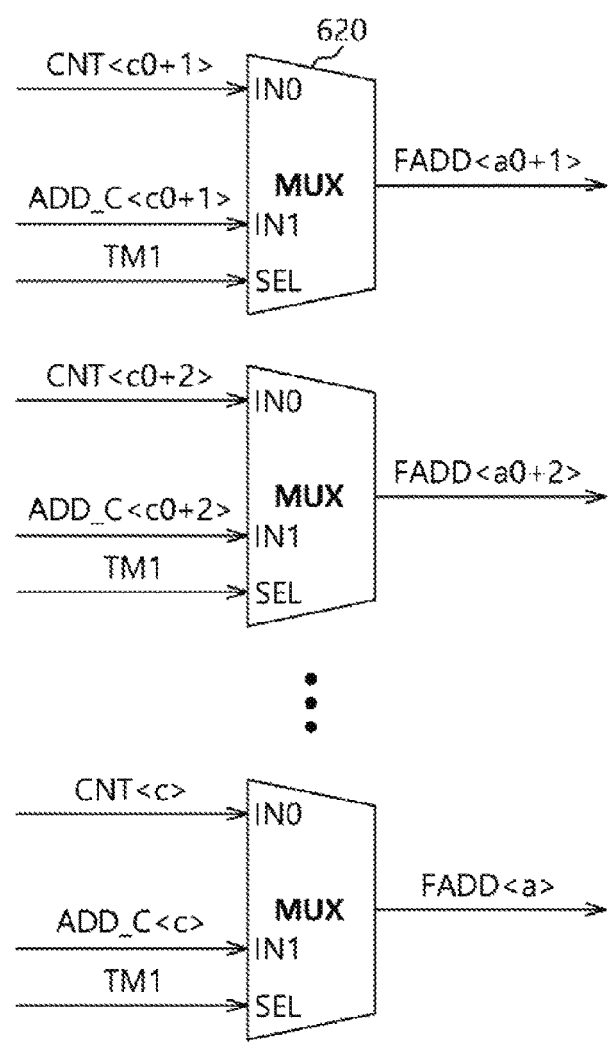

FIG. 5 is a diagram, illustrating a representation of an example of a configuration of an address control circuit, illustrated in FIG. 3.

Referring to FIG. 5, the address control circuit 600 may include a buffer array 610 and a plurality of multiplexers 620.

The buffer array 610 may include a plurality of buffers 620.

The plurality of buffers 620 may buffer partial bits CNT<0:c0> of the count signal CNT<0:d> and may output partial bits FADD<0:a0> of the fuse address FADD<0:a>.

The plurality of multiplexers 620 may receive partial bits CNT<c0+1:c> of the count signal CNT<0:d> and partial bits ADD_C<c0+1:c> of the defective address ADD_C<0:c>, and the plurality of multiplexers may output one of the partial bits based on, as the remaining bits FADD<a0+1:a> of the fuse address FADD<0:a> based on the test mode signal TM<1>.

When the test mode signal TM<1> is enabled, the plurality of multiplexers 620 may select partial bits ADD_C<c0+1:c> of the defective address ADD_C<0:c> and may output the selected bits as the remaining bits FADD<a0+1:a> of the fuse address FADD<0:a>.

When the test mode signal TM<1> is disabled, the plurality of multiplexers 620 may select partial bits CNT<c0+1:c> of the count signal CNT<0:d> and may output the selected bits as the remaining bits FADD<a0+1:a> of the fuse address FADD<0:a>.

When the test mode signal TM<1> is enabled, an operation of searching for an available fuse for the row repair is performed.

Therefore, a value of the partial bits FADD<0:a0> of the fuse address FADD<0:a> may change by utilizing the partial bits CNT<0:c0> of the count signal CNT<0:d>, and a value of the remaining bits FADD<a0+1:a> of the fuse address FADD<0:a> may be fixed by utilizing the partial bits ADD_C<c0+1:c> of the defective address ADD_C<0:c>.

As described above, through the operation of the address control circuit 600 when the test mode signal TM<1> is enabled, an operation of searching for an available fuse in a region for the row repair, other than regions for the test mode data and the column repair within all regions of the fuse array 200, may be performed.

Figure 6:
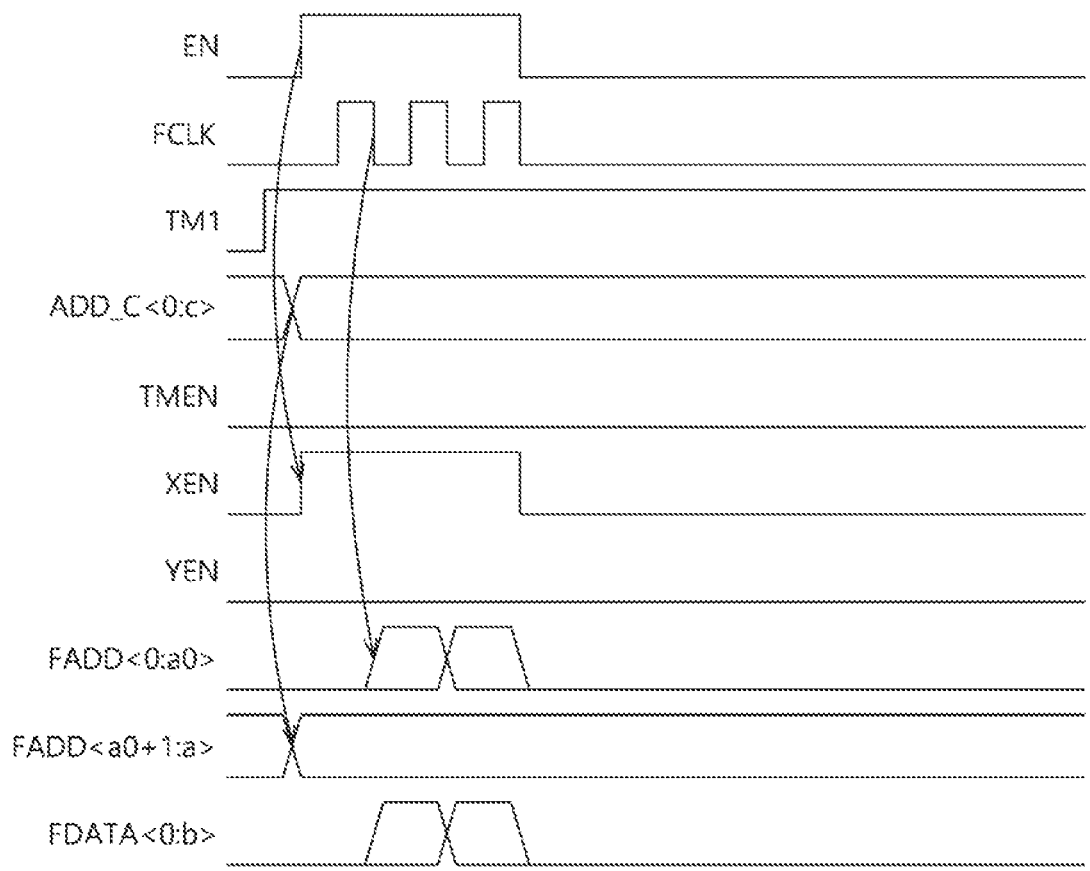
FIG. 6 is a timing diagram, illustrating a representation of an example of an operation of an OTP memory circuit of a semiconductor apparatus, in accordance with an embodiment of the present disclosure.

FIG. 6 is a timing diagram, illustrating a representation of an example of an operation of an OTP memory circuit of a semiconductor apparatus, in accordance with an embodiment of the present disclosure.

It is assumed that the row repair is performed based on the defective address ADD_C<0:c>, detected through a test of a semiconductor apparatus.

The test mode signal TM<1>, related to the row repair, may be enabled among the test mode signals TM<0:2c>.

When the enable signal EN is enabled, the defective address ADD_C<0:c> may be input to the fuse address generation circuit 300.

As the test mode signal TM<1> is enabled, the second section signal XEN may be enabled among the first to third section signals TMEN, XEN, and YEN.

A value of the count signal CNT<0:d> may change based on the clock signal FCLK that occurs while the enable signal EN is enabled.

As described with reference to FIG. 5, the partial bits CNT<0:c0> of the count signal CNT<0:d> may be output as the partial bits FADD<0:a0> of the fuse address FADD<0:a>.

Since the test mode signal TM<1> is being enabled, the partial bits ADD_C<c0+1:c> of the defective address ADD_C<0:c> may be output as the partial bits FADD<a0+1:a> of the fuse address FADD<0:a>.

Therefore, the value of the partial bits FADD<0:a0> of the fuse address FADD<0:a> may change based on the clock signal FCLK that occurs while the enable signal EN is enabled. However, the value of the remaining bits FADD<a0+1:a> of the fuse address FADD<0:a> may be kept without change.

Among the regions within the fuse array 200, the second region, related to the row repair, may be selected by the upper bits FADD<a0+1:a> of the fuse address FADD<0:a>.

Based on change of the value of the partial bits FADD<0:a0> of the fuse address FADD<0:a>, the electrical fuses within the second region may be sequentially selected and the corresponding fuse data FDATA<0:b> may be sequentially output.

Based on the value of the fuse data FDATA<0:b>, it may be determined whether the corresponding fuses are available fuses.

As described above, in accordance with an embodiment of the present disclosure, the search for an available fuse may be promptly and precisely performed by selecting a particular region corresponding to the defective address ADD_C<0:c> without searching all regions of the fuse array 200. In other words, the search does not involve all of the regions related to the test mode, the region allocated for the row repair and the region allocated for the column repair.

Figure 7:
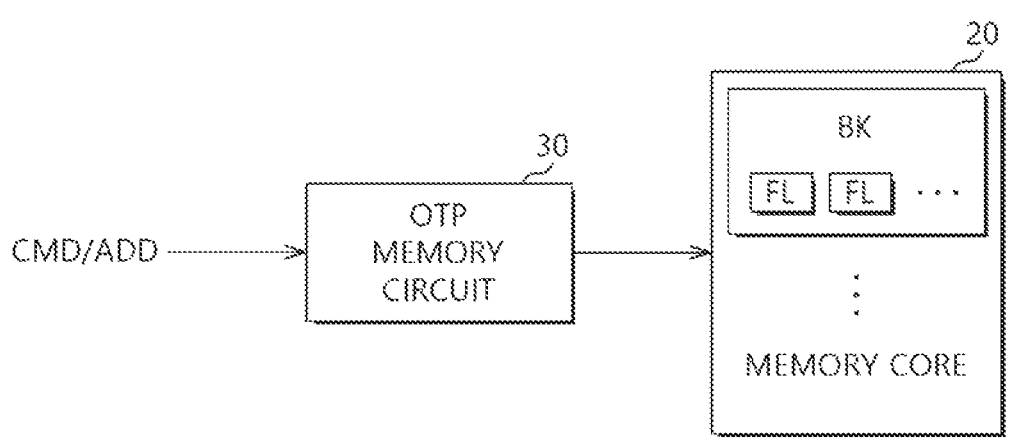
FIG. 7 is a diagram, illustrating a representation of an example of a configuration of a semiconductor apparatus, in accordance with an embodiment of the present disclosure.

FIG. 7 is a diagram, illustrating a representation of an example of a configuration of a semiconductor apparatus, in accordance with an embodiment of the present disclosure.

Referring to FIG. 7, in accordance with an embodiment of the present disclosure, the semiconductor apparatus 11 may include a memory core 20 and a One-time Programmable (OTP) memory circuit 31.

The memory core 20 may be configured in the same way as the memory core 20 illustrated in FIG. 1.

The OTP memory circuit 31 may include a plurality of electrical fuses.

Based on a command CMD, the OTP memory circuit 31 may store repair-related information (i.e., address ADD related to operations of a normal repair and a hard-post package repair HPPR and/or test mode information) into the plurality of electrical fuses.

The OTP memory circuit 31 may store the address ADD into the plurality of electrical fuses, the address ADD externally provided in a HPPR mode.

The OTP memory circuit 31 may determine whether address ADD, which is externally provided in a SPPR mode, is already stored in the plurality of electrical fuses. Based on a result of the determination, the OTP memory circuit 31 may store the address ADD or an initial value into a latch array FL of the memory core 20.

The OTP memory circuit 31 may output the repair-related information to an external of the OTP memory circuit 31 based on a command CMD.

The repair-related information output from the OTP memory circuit 31 may be provided to the memory core 20 and/or an external component, outside of the semiconductor apparatus 11.

As described above, the SPPR control circuit 40, included in the semiconductor apparatus 10 illustrated in FIG. 1, may be configured to store an address in a SPPR mode and may be configured to control the OTP memory circuit 30 through the determination of redundancy of a defective address.

However, in accordance with an embodiment of the present disclosure, the OTP memory circuit 31 of the semiconductor apparatus 11 may perform an operation of controlling the output of the repair-related information by determining the redundant repair, an operation of storing an address in a HPPR mode, and an operation of storing an address in a SPPR mode as described above.

Therefore, in accordance with an embodiment of the present disclosure, the semiconductor apparatus 11 might not be required to comprise the SPPR control circuit 40 illustrated in FIG. 1.

Figure 8:
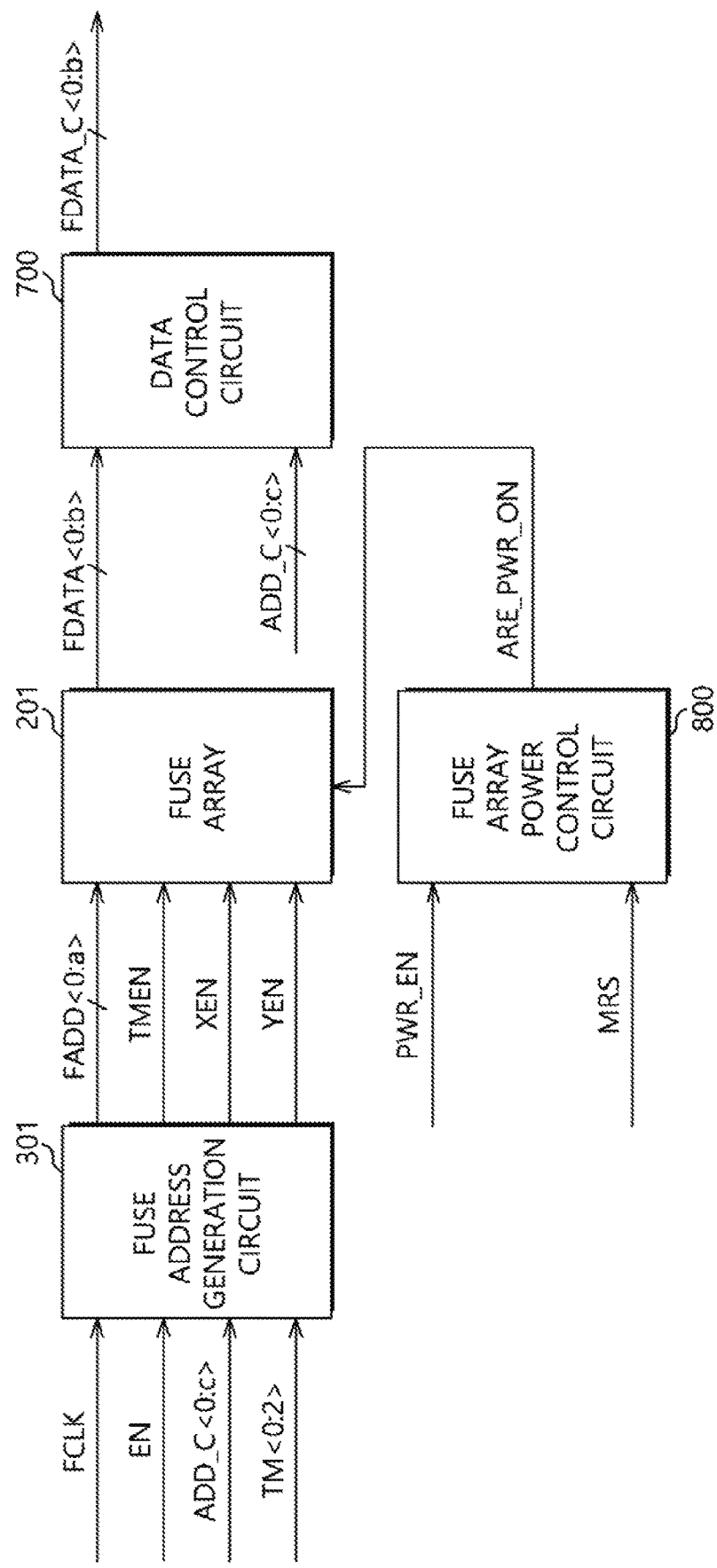
FIG. 8 is a diagram, illustrating a representation of an example of a configuration of an OTP memory circuit of a semiconductor apparatus, in accordance with an embodiment of the present disclosure.

FIG. 8 is a diagram, illustrating a representation of an example of a configuration of an OTP memory circuit of a semiconductor apparatus, in accordance with an embodiment of the present disclosure.

Referring to FIG. 8, in accordance with an embodiment of the present disclosure, the OTP memory circuit 101 of a semiconductor apparatus may include a fuse array 201, a fuse address generation circuit 301, a data control circuit 700 and a fuse array power control circuit 800.

The fuse array 201 and the fuse address generation circuit 301 may be configured in the same way as the fuse array 200 and the fuse address generation circuit 300 described with reference to FIGS. 2 to 5.

The data control circuit 700 may generate corrected fuse data FDATA_C<0:b> based on a result of comparing the fuse data FDATA<0:b> with the defective address ADD_C<0:c>.

The data control circuit 700 may output one of the fuse data FDATA<0:b>, the defective address ADD_C<0:c>, and the initial value of the fuse data FDATA<0:b> as the corrected fuse data FDATA_C<0:b> based on the result of comparing the fuse data FDATA<0:b> with the defective address ADD_C<0:c>.

The initial value of the fuse data FDATA<0:b> may be a value of the fuse data FDATA<0:b> before programming and the initial value of all bits of the fuse data FDATA<0:b> may be of logic low.

The fuse array power control circuit 800 may generate a fuse array power control signal ARE_PWR_ON based on a power enable signal PWR_EN and a mode register signal MRS.

The OTP memory circuit 101 may utilize separate power since the OTP memory circuit 101 operates in a particular operation mode, such as an operation of programming a defective address detected through a test of a semiconductor apparatus, an operation of reading in advance fuse data into separate latches during boot-up of a semiconductor apparatus, and so forth.

When the fuse array power control signal ARE_PWR_ON is is enabled, the separate power may be provided to the OTP memory circuit 101.

The timing for when the fuse array power control signal ARE_PWR_ON is enabled may be adjusted based on the mode register signal MRS, which is generated through the change of setting a mode register set.

Figure 9:
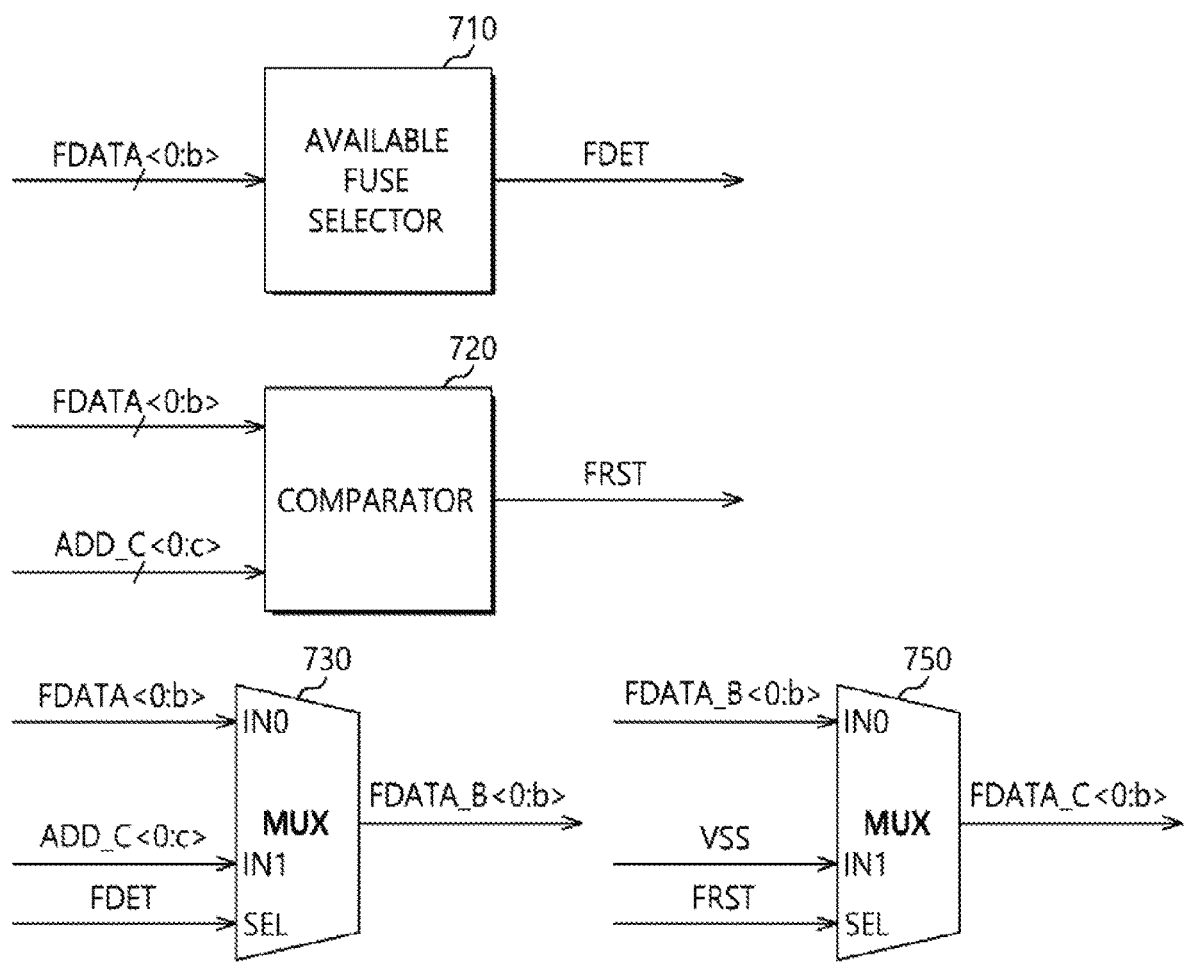
FIG. 9 is a diagram, illustrating a representation of an example of a configuration of a data control circuit, illustrated in FIG. 8.

FIG. 9 is a diagram, illustrating a representation of an example of a configuration of a data control circuit, illustrated in FIG. 8.

Referring to FIG. 9, the data control circuit 700 may include an available fuse selector 710, a comparator 720, a first multiplexer 730 and a second multiplexer 750.

The available fuse selector 710 may generate a detection signal FDET, indicating an available fuse set, based on at least one bit of the fuse data FDATA<0:b>.

Among electrical fuses within a fuse set, an enable fuse may be assigned to indicate whether the fuse set is already in use, and a disabled fuse may be assigned to indicate whether the fuse set is defective. Therefore, an available fuse set may be detected based on logic levels of particular bits corresponding to the enable fuse and the disable fuse within the fuse data FDATA<0:b>.

The available fuse selector 710 may enable the detection signal FDET when an enable bit and a disable bit have a disabled level within the fuse data FDATA<0:b>.

For example, when assuming that a disabled level of the enable bit and the disable bit is a low level and an enabled level of the detection signal FDET is a high level, the available fuse selector 710 may include a NOR gate logic configured to receive the levels of the enable bit and the disabled bit and output the result of a NOR operation on the levels of the enable bit and the disabled bit as the detection signal FDET.

The comparator 720 may generate a fuse reset signal FRST by comparing the fuse data FDATA<0:b> to the defective address ADD_C<0:c>.

The comparator 720 may enable the fuse reset signal FRST to a high level when the fuse data FDATA<0:b> and bits corresponding to the fuse data FDATA<0:b> of the defective address ADD_C<0:c> have the same logic level.

The first multiplexer 730 may output one of the fuse data FDATA<0:b> and the defective address ADD_C<0:c> as the preliminarily corrected fuse data FDATA_B<0:b> based on the detection signal FDET.

The first multiplexer 730 may output the fuse data FDATA<0:b> as the preliminarily corrected fuse data FDATA_B<0:b> when the detection signal FDET has a low level.

The first multiplexer 730 may output the defective address ADD_C<0:c> as the preliminarily corrected fuse data FDATA_B<0:b> when the detection signal FDET has a high level.

The high level of the detection signal FDET may represent that a currently searched fuse set is an available fuse set. Therefore, the first multiplexer 730 may select the defective address ADD_C<0:c>, which should be programmed, instead of the fuse data FDATA<0:b> having an initial value.

The second multiplexer 750 may output one of the preliminarily corrected fuse data FDATA_B<0:b> and the level of a ground voltage VSS as the corrected fuse data FDATA_C<0:b> based on the fuse reset signal FRST.

The second multiplexer 750 may output the preliminarily corrected fuse data FDATA_B<0:b> as the corrected fuse data FDATA_C<0:b> when the fuse reset signal FRST has a low level.

The second multiplexer 750 may reset the corrected fuse data FDATA_C<0:b> to have an initial value by selecting the level of the ground voltage VSS instead of the preliminarily corrected fuse data FDATA_B<0:b> when the fuse reset signal FRST has a high level.

The high level of the fuse reset signal FRST may represent that the fuse data FDATA<0:b> is the same as the defective address ADD_C<0:c>. Therefore, in order to prevent redundant repair on the same address, fuse data (i.e., the fuse data FDATA<0:b>) finally output from the OTP memory circuit 101 should be reset to have an initial value.

The redundant repair may be an additional repair of a defective address by the SPPR, the defective address having been already repaired by the HPPR.

Figure 10:
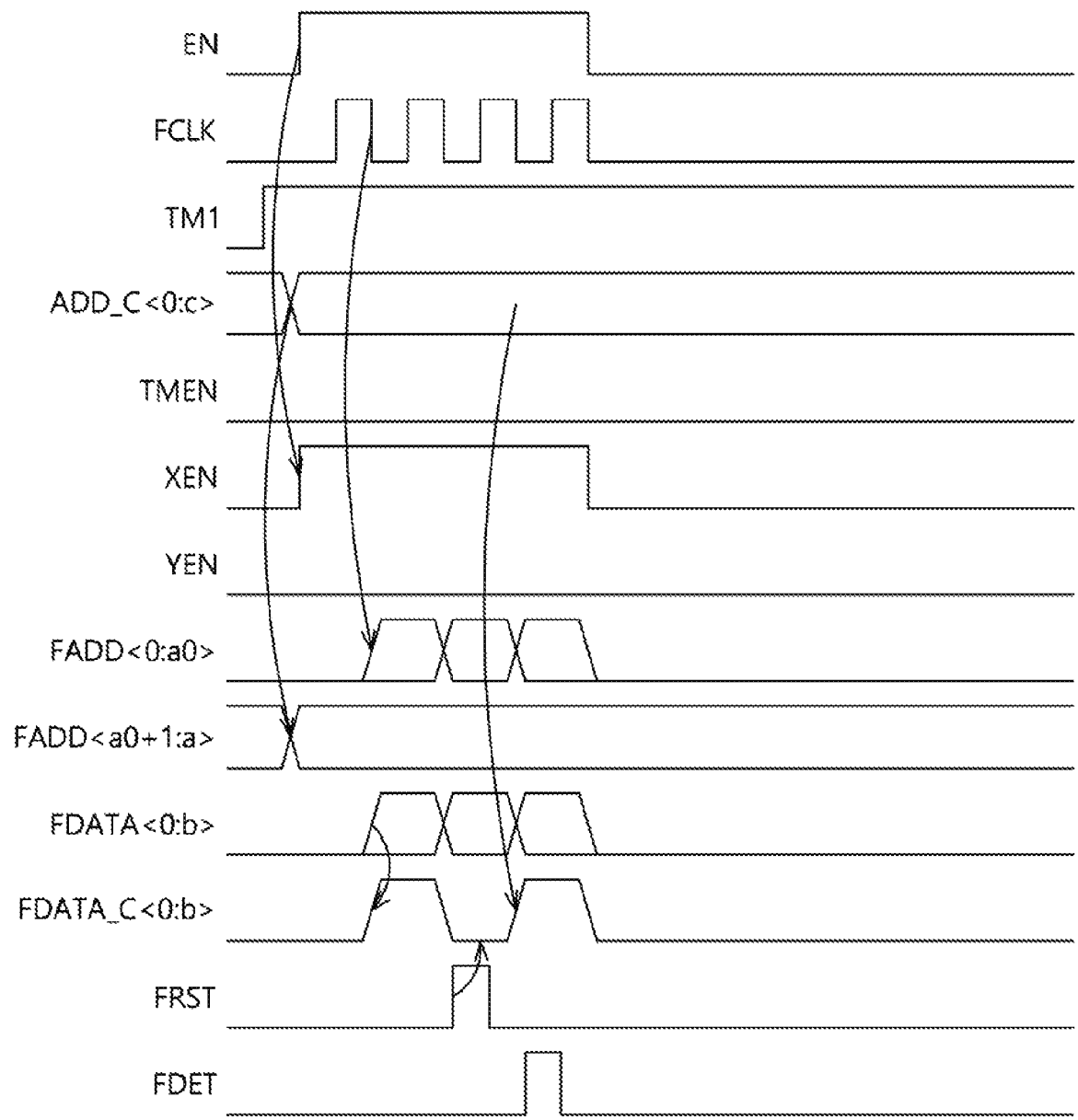
FIG. 10 is a timing diagram, illustrating a representation of an example of an operation of an OTP memory circuit of a semiconductor apparatus, in accordance with an embodiment of the present disclosure.

FIG. 10 is a timing diagram, illustrating a representation of an example of an operation of an OTP memory circuit of a semiconductor apparatus in accordance with an embodiment of the present disclosure.

It is assumed that a row repair is performed, in a SPPR mode, based on the defective address ADD_C<0:c>, detected through a test of a semiconductor apparatus.

The test mode signal TM<1>, related to the row repair, may be enabled.

When the enable signal EN is enabled, the defective address ADD_C<0:c> may be input to the fuse address generation circuit 301.

As the test mode signal TM<1> is enabled, the second section signal XEN may be enabled among the first to third section signals TMEN, XEN, and YEN.

A value of the count signal CNT<0:d> may change based on the clock signal FCLK, which occurs while the enable signal EN is enabled.

As described with reference to FIG. 5, the partial bits CNT<0:c0> of the count signal CNT<0:d> may be output as the partial bits FADD<0:a0> of the fuse address FADD<0:a>.

Since the test mode signal TM<1> is being enabled, the partial bits ADD_C<c0+1:c> of the defective address ADD_C<0:c> may be output as the partial bits FADD<a0+1:a> of the fuse address FADD<0:a>.

Therefore, the value of the partial bits FADD<0:a0> of the fuse address FADD<0:a> may change based on the clock signal FCLK that occurs while the enable signal EN is enabled; but the value of the remaining bits FADD<a0+1:a> of the fuse address FADD<0:a> may be kept without change.

Among the regions within the fuse array 200, the second region related to the row repair may be selected by the upper bits FADD<a0+1:a> of the fuse address FADD<0:a>.

Based on change of the value of the partial bits FADD<0:a0> of the fuse address FADD<0:a>, the electrical fuses within the second region may be sequentially selected and corresponding fuse data FDATA<0:b> may be sequentially output.

Based on the value of the fuse data FDATA<0:b>, it may be determined whether corresponding fuses are available fuses.

Here, it is assumed that the fuse data FDATA<0:b>, output from the second fuse set, which is selected based on the value change of the partial bits FADD<0:a0> of the fuse address FADD<0:a>, has the same value as the defective address ADD_C<0:c>, and the third fuse set is an available fuse set.

Since the fuse data FDATA<0:b> output from a first fuse set has a different value from the defective address ADD_C<0:c>, and the first fuse set is not an available fuse set, both of the fuse reset signal FRST and the detection signal FDET may have a low level.

Referring to FIG. 9, the fuse data FDATA<0:b> may be output as the corrected fuse data FDATA_C<0:b> because both of the fuse reset signal FRST and the detection signal FDET have a low level.

Since it is the SPPR mode, the corrected fuse data FDATA_C<0:b> might not be programmed into the fuse array 201 and may be stored in a latch set of a turn corresponding to the first fuse set within the latch array FL of the memory core 20.

Since the fuse data FDATA<0:b>, output from the second fuse set, has the same value as the defective address ADD_C<0:c>, the fuse reset signal FRST may have a high level.

Based on the high level of the fuse reset signal FRST, the second multiplexer 750 may output the level of the ground voltage VSS as the corrected fuse data FDATA_C<0:b>. That is, the value of the corrected fuse data FDATA_C<0:b> may be initialized.

Since it is the SPPR mode, the corrected fuse data FDATA_C<0:b> might not be programmed into the fuse array 201 and may be stored in a latch set of a turn corresponding to the second fuse set within the latch array FL of the memory core 20.

Here, since the corrected fuse data FDATA_C<0:b> has the level of the ground voltage VSS, the latch set of a turn corresponding to the second fuse set within the latch array FL of the memory core 20 might not store any information and thus a redundant repair may be prevented on the same address.

Since the third fuse set is an available fuse set, the detection signal FDET may have a high level.

Based on the high level of the detection signal FDET, the first multiplexer 730 may output the defective address ADD_C<0:c> as the preliminarily corrected fuse data FDATA_B<0:b>.

Based on the low level of the fuse reset signal FRST, the second multiplexer 750 may output the preliminarily corrected fuse data FDATA_B<0:b> as the corrected fuse data FDATA_C<0:b>.

Since it is the SPPR mode, the corrected fuse data FDATA_C<0:b> might not be programmed into the fuse array 201 and may be stored in a latch set of a turn corresponding to the third fuse set within the latch array FL of the memory core 20.

As described above, in accordance with an embodiment of the present disclosure, search for an available fuse may be promptly and precisely performed by selecting a particular region corresponding to the defective address ADD_C<0:c> without searching all regions of the fuse array 201. In other words, the search does not involve all of the regions related to the test mode, the region allocated for the row repair and the region allocated for the column repair. Further, a redundant repair in the SPPR operation may be prevented on an address that has been already repaired by the HPPR operation.

While certain embodiments have been described above, it will be understood to those skilled in the art that the embodiments described are by way of example only. Accordingly, the one-time programmable memory circuit and semiconductor apparatus including the same should not be limited based on the described embodiments. Rather, the one-time programmable memory circuit and semiconductor apparatus including the same described herein should only be limited in light of the claims that follow when taken in conjunction with the above description and accompanying drawings.

What is claimed is:

1. A one-time programmable (OTP) memory circuit comprising:
 a fuse array including a plurality of fuse sets divided into a first region allocated for a row repair and a second region allocated for a column repair and configured to output fuse data of a fuse set corresponding to a fuse address among the plurality of fuse sets; and
 a fuse address generation circuit configured to change a value of the fuse address to search for an available fuse set within only one region corresponding to a defective address among the first region and the second region.

2. The OTP memory circuit of claim 1, wherein the fuse address generation circuit includes:
 a counter configured to generate a count signal based on a clock signal;
 a section signal generation circuit configured to generate a plurality of section signals based on the count signal and test mode signals; and
 an address control circuit configured to generate the fuse address based on one among the test mode signals, the defective address and the count signal.

3. The OTP memory circuit of claim 2, wherein the fuse array is configured to output the fuse data based on the fuse address during enabled sections of the plurality of section signals.

4. The OTP memory circuit of claim 1, wherein the fuse address generation circuit is configured to generate the fuse address based on an enable signal, a clock signal, test mode signals and the defective address.

5. The OTP memory circuit of claim 2, wherein the count signal has a value corresponding to an address for selecting all regions of the fuse array.

6. The OTP memory circuit of claim 2,
wherein the section signals include first to third section signals, and
wherein the first section signal is configured to indicate a search section including test mode data, the second section signal is configured to indicate a search section including an available fuse related to a row repair, and the third section signal is configured to indicate a search section including an available fuse related to a column repair.

7. The OTP memory circuit of claim 1, further comprising a rupture circuit configured to program the defective address into the available fuse set in a Post Package Repair mode.

8. A one-time programmable (OTP) memory circuit comprising:
a fuse array including a plurality of fuse sets divided into a first region allocated for a row repair and a second region allocated for a column repair and configured to output fuse data of a fuse set corresponding to a fuse address among the plurality of fuse sets;
a fuse address generation circuit configured to change a value of the fuse address to search for an available fuse set within only one region corresponding to a defective address among the first region and the second region; and
a data control circuit configured to output corrected fuse data, as an initial value of the fuse data, based on a result of comparing the fuse data with the defective address.

9. The OTP memory circuit of claim 8, further comprising a rupture circuit configured to program the defective address into the available fuse set in a Hard-Post Package Repair mode (HPPR).

10. The OTP memory circuit of claim 9, wherein the data control circuit is configured to operate in a Soft-Post Package Repair mode (SPPR).

11. The OTP memory circuit of claim 8, wherein the fuse address generation circuit includes:
a counter configured to generate a count signal based on a clock signal;
a section signal generation circuit configured to generate a plurality of section signals based on the count signal and test mode signals; and
an address control circuit configured to generate the fuse address based on one among the test mode signals, the defective address and the count signal.

12. The OTP memory circuit of claim 11, wherein the fuse array is configured to output the fuse data based on the fuse address during enabled sections of the plurality of section signals.

13. The OTP memory circuit of claim 8, wherein the fuse address generation circuit is configured to generate the fuse address based on an enable signal, a clock signal, test mode signals and the defective address.

14. The OTP memory circuit of claim 11, wherein the count signal has a value corresponding to an address for selecting all regions of the fuse array.

15. The OTP memory circuit of claim 11,
wherein the section signals include first to third section signals, and
wherein the first section signal is configured to indicate a search section including test mode data, the second section signal is configured to indicate a search section including an available fuse related to a row repair, and the third section signal including configured to indicate a search section of an available fuse related to a column repair.

16. The OTP memory circuit of claim 8, wherein the data control circuit is configured to output, as the corrected fuse data, the fuse data or the defective address or an initial value of the fuse data based on a result of comparing the fuse data with the defective address.

17. The OTP memory circuit of claim 8, wherein the data control circuit includes:
an available fuse selector configured to generate a detection signal indicating an available fuse set based on at least one bit within the fuse data;
a comparator configured to generate a fuse reset signal by comparing the fuse data with the defective address;
a first multiplexer configured to output, as preliminarily corrected fuse data, one between the fuse data and the defective address based on the detection signal; and
a second multiplexer configured to output, as the corrected fuse data, one between the preliminarily corrected fuse data and a level of a ground voltage based on the fuse reset signal.

18. A semiconductor apparatus comprising:
a memory cell array including a plurality of unit memory blocks, wherein a latch array is included in the plurality of unit memory blocks; and
a one-time programmable (OTP) memory circuit with a plurality of fuse sets,
wherein the OTP memory circuit is configured to program an externally-inputted defective address into the plurality of fuse sets in a Hard-Post Package Repair (HPPR) operation and configured to output the defective address or an initial value to the latch array based on a result of determining whether the defective address has been already programmed into the plurality of fuse sets in a Soft-Post Package Repair (SPPR) operation.

19. The semiconductor apparatus of claim 18, wherein the latch array is configured to store repair-related information, including the defective address, in a boot-up operation of the semiconductor apparatus.

20. The semiconductor apparatus of claim 18, wherein the OTP memory circuit includes:
a fuse array configured to output fuse data of a fuse set corresponding to a fuse address among the plurality of fuse sets;
a fuse address generation circuit configured to generate the fuse address to search for an available fuse set within a particular region corresponding to the defective address among a plurality of regions of the fuse array; and
a data control circuit configured to output corrected fuse data, as an initial value of the fuse data, based on a result of comparing the fuse data with the defective address.

21. The semiconductor apparatus of claim 20, further comprising a rupture circuit configured to program the defective address into the available fuse set in the HPPR mode.

22. The semiconductor apparatus of claim 20, wherein the fuse array is configured to output the fuse data based on the fuse address during enabled sections of a plurality of section signals.

23. The semiconductor apparatus of claim 20, wherein the fuse address generation circuit is configured to generate the fuse address based on an enable signal, a clock signal, test mode signals and the defective address.

24. The semiconductor apparatus of claim 20, wherein the data control circuit includes:
- an available fuse selector configured to generate a detection signal indicating the available fuse set based on at least one bit within the fuse data;
- a comparator configured to generate a fuse reset signal by comparing the fuse data with the defective address;
- a first multiplexer configured to output, as preliminarily corrected fuse data, one between the fuse data and the defective address based on the detection signal; and
- a second multiplexer configured to output, as the corrected fuse data, one between the preliminarily corrected fuse data and a level of a ground voltage based on the fuse reset signal.

* * * * *

UNITED STATES PATENT AND TRADEMARK OFFICE
CERTIFICATE OF CORRECTION

| | | |
|---|---|---|
| PATENT NO. | : 11,328,787 B2 | Page 1 of 1 |
| APPLICATION NO. | : 16/709535 | |
| DATED | : May 10, 2022 | |
| INVENTOR(S) | : Jung | |

It is certified that error appears in the above-identified patent and that said Letters Patent is hereby corrected as shown below:

On the Title Page

Item (72) Inventor:
Replace "Chui Moon JUNG, Icheon-si (KR)" with --Chul Moon JUNG, Icheon-si Gyeonggi-do (KR)--

Signed and Sealed this
Second Day of August, 2022

Katherine Kelly Vidal
*Director of the United States Patent and Trademark Office*